United States Patent
Myers

(10) Patent No.: US 6,658,241 B1
(45) Date of Patent: Dec. 2, 2003

(54) RADIO RECEIVER AUTOMATIC FREQUENCY CONTROL TECHNIQUES

(75) Inventor: Michael H. Myers, Poway, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 478 days.

(21) Appl. No.: 09/676,007

(22) Filed: Sep. 29, 2000

(51) Int. Cl.[7] .................................................. H04B 1/18
(52) U.S. Cl. ........................ 455/192.1; 455/192.2; 455/255; 455/257
(58) Field of Search ........................... 455/192.1, 192.2, 455/313, 255, 257, 259, 260, 84; 375/344, 343, 346

(56) References Cited

U.S. PATENT DOCUMENTS

| | | | |
|---|---|---|---|
| 4,580,102 A | | 4/1986 | Myers |
| 5,418,815 A | * | 5/1995 | Ishikawa et al. ............. 375/344 |
| 5,440,587 A | * | 8/1995 | Ishikawa et al. ........... 455/192.2 |
| 5,500,878 A | * | 3/1996 | Iwasaki ......................... 375/344 |
| 5,684,836 A | * | 11/1997 | Nagayasu et al. ............ 329/346 |
| 5,784,403 A | * | 7/1998 | Scott ............................. 375/343 |
| 6,081,563 A | * | 6/2000 | Taga et al. .................... 375/344 |
| 6,343,207 B1 | * | 1/2002 | Hessel et al. .................... 455/84 |

* cited by examiner

Primary Examiner—Edward F. Urban
Assistant Examiner—Lana Le
(74) Attorney, Agent, or Firm—McAndrews, Held & Malloy, Ltd.

(57) ABSTRACT

An automatic frequency control loop implemented by a digital signal processor (14) down converts an IF signal carrier to a residual-carrier within an allowed range of frequencies by a down converter operation (16). A frequency detector (28) detects any error frequency in the residual carrier with reference to a reference frequency, such as 0 Hz, in order to shift the frequency of the residual carrier by a shifter operation (20) which reduces the frequency error in the shifted signal. An envelope detector operation (26) retrieves information from the residual carrier, and the resulting signals are processed by a low pass filter operation (36) to reduce cross talk.

25 Claims, 1 Drawing Sheet

RADIO RECEIVER AUTOMATIC FREQUENCY CONTROL TECHNIQUES

BACKGROUND OF THE INVENTION

This invention relates to automatic frequency control for radio receivers, and more particularly relates to such control employing frequency error detection.

Regulatory agencies have recently imposed a tighter frequency packing of channels (Mode 0 Narrowband) for the next generation VHF commercial air traffic control links. The new regulations have created a need for automatic frequency centering of the received band pass signal in order to prevent filter distortion and to improve receiver sensitivity performance. The new regulations also necessitate techniques for dealing with the inherent frequency drift of transmitters and receivers as well as the frequency shift due to doppler. This invention addresses all of these problems and provides a solution.

BRIEF SUMMARY OF THE INVENTION

The preferred embodiment is suitable for use in a radio receiver of a carrier signal including an error which shifts the frequency of the carrier signal relative to a first reference frequency. The carrier signal is modulated by a baseband signal containing information to be detected. The information is required to lie within an allowed frequency range.

The preferred embodiment provides automatic frequency control by generating a residual carrier signal modulated by the baseband signal in response to the carrier signal. The generation of the residual carrier signal is preferably accomplished by a converter. The residual carrier signal has a residual frequency range within the allowed frequency range. The frequency of the residual carrier signal is shifted to generate a frequency shifted signal in response to a control signal. The frequency shifting is preferably accomplished by a frequency shifter. The control signal is generated in response to any frequency error in the frequency shifted signal relative to a second reference frequency. The control signal preferably is generated by a frequency detector. As a result of the generation of the control signal, the frequency error in the frequency shifted signal is reduced. Information from the frequency shifted signal is detected, preferably by an information detector. The frequency shifted signal is filtered, preferably by a filter which passes frequencies within the allowed frequency range.

By using the foregoing techniques, frequency can be controlled to reduce cross talk and to provide improved radio reception within a relatively narrow band of allowed frequencies with a degree of accuracy and economy previously unavailable.

DETAILED DESCRIPTION OF THE PREFERRED EMBODIMENTS

Figure 1:
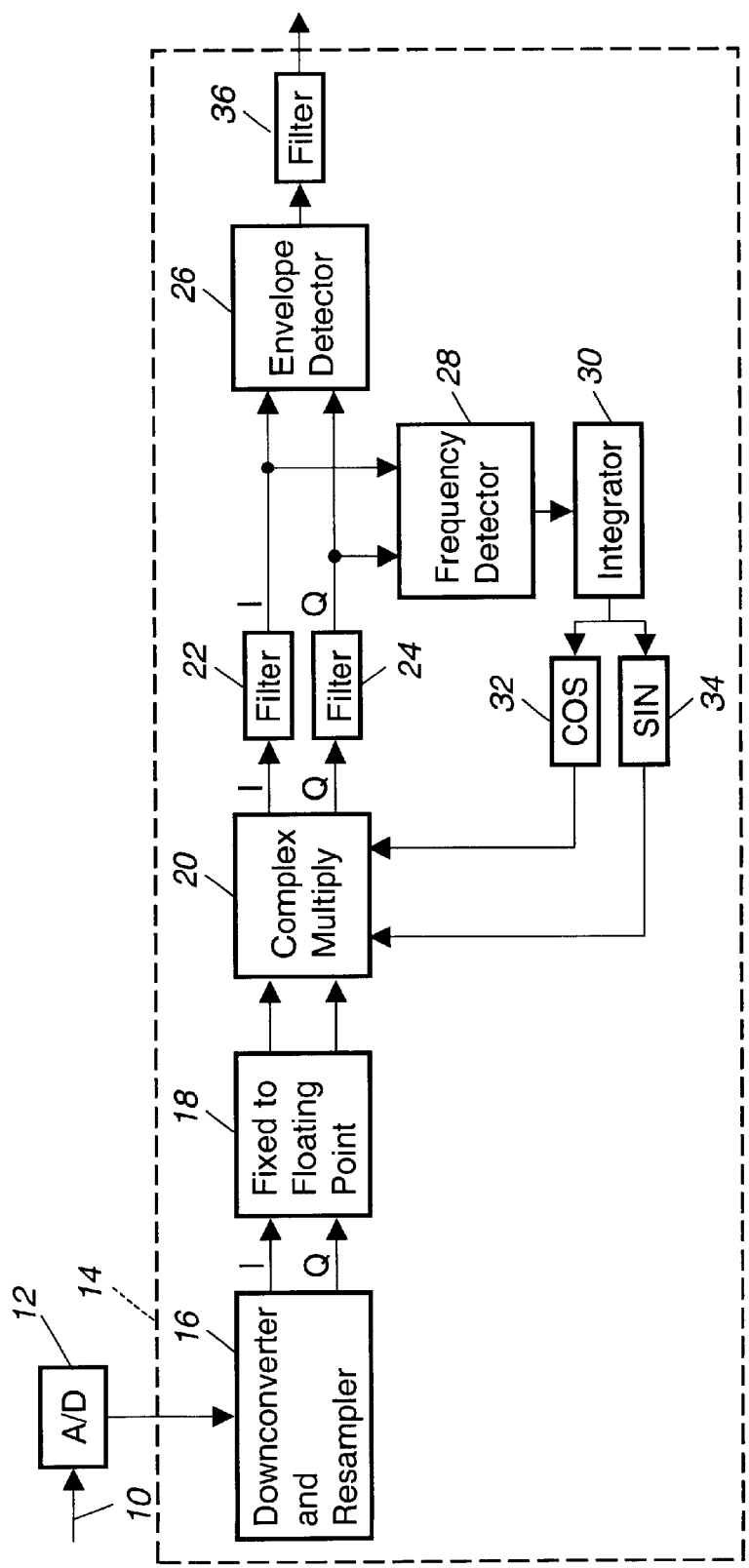
FIG. 1 is a schematic and operational block diagram of a preferred form of the invention.

Referring to FIG. 1, the preferred embodiment is particularly useful in a radio receiver to receive VHF signals according to a Mode 0 Narrowband specification which limits the detected information to 6 kHz wide narrowband channels spaced 8.33 kHz apart. According to the Mode 0 Narrowband specification, the information is provided in a baseband signal which is used to amplitude modulate a carrier signal relative to a series of preset broadcast reference frequencies from 118 MHz–137 MHz. According to the Mode 0 Narrowband specification, the baseband frequencies must be confined to an allowable frequency range on 8.33 kHz centers.

Due to errors in the carrier signal modulation and transmission equipment, as well as due to doppler effects, the carrier signal typically has an error which shifts its frequency relative to the reference broadcast frequency at which it should be operating. The frequency error makes it difficult to maintain the detected information in the baseband signal to within the 6 kHz narrowband channel.

FIG. 1 illustrates a preferred form of an automatic frequency control device for use in the radio receiver of an aircraft which receives the carrier frequency and converts it to an intermediate frequency (IF) carrier of about 21.4 MHz in a well known manner. The intermediate frequency still includes the error which shifted the carrier signal as previously described. The IF carrier is transmitted to a conductor 10 and is converted to digital form by an analog to digital converter 12.

A digital signal processor (DSP) 14 performs a down converter and resampler operation 16 which filters the IF signal to plus or minus 21 kHz and down converts the IF signal to generate a residual carrier signal modulated by the baseband signal. The residual carrier signal has a residual frequency range within the allowed frequency range of +/−3 kHz. The operation of the down converter is such that in the absence of a frequency error in the carrier, and in the absence of a baseband signal, the output of operation 16 would be a signal of 0 Hz.

Operation 16 also resamples the signals to a 42 K samples per second data stream employing quadrature I and Q signals as shown. The I and Q signals are used as inputs to a fixed to floating point operation 18 which converts the signals to a form suitable for floating point arithmetic operations by DSP 14.

The floating point signals are subjected to a complex multiply operation 20. The output of operation 20 is subjected to filter operations 22 and 24 which provide 2.7 kHz filtering of every other sample of the incoming I and Q data streams. The signals resulting from filter operations 22 and 24 are subjected to an envelope detector operation 26 and are subjected to a frequency detector operation 28. The frequency detector operation may take the form of the detector described in U.S. Pat. No. 4,580,102 (Myers, issued Apr. 1, 1986) which is incorporated by reference into this application. However, other frequency detectors also may be used.

Frequency detector operation 28 generates an estimated frequency error in the residual carrier frequency with respect to a reference frequency of 0 Hz. The frequency error value is integrated in an integrator operation 30 and is converted to a complex exponential form by cosine and sine operations 32 and 34. As explained in U.S. Pat. No. 4,580,102 frequency detector operation 28 executes a maximum a-posteriori estimate algorithm.

Frequency detector operation 28 is able to estimate the error frequency in response to groups of signal values having a single polarity, either all positive or all negative. As a result, operation 28 can estimate frequency error without requiring signals with 0 crossings. Using a 0 crossing counter decreases the speed of operation since low frequencies typically have no 0 crossings in the short times required to make an estimate. Detector 28 is able to estimate the error frequency by integrating only about 14 signal samples. As a result, it is able to respond and correct frequency errors in less than 10 milliseconds.

The complex exponential signal provided from operations 32 and 34 to complex multiply operation 20 result in the correction of the error frequency in the signals transmitted to operation 20.

The frequency shifted signal generated by complex multiply operation 20 is used to accomplish an envelope detector operation 26. In the preferred embodiment, the envelope detector operation detects the envelope of the signals received from filter operations 22 and 24. An envelope detector operation is used because the original transmitted carrier signal was modulated by amplitude modulation. The information recovered by the envelope detector operation 26 is filtered by a filter operation 36 which passes a range of frequencies less than the allowed frequency range of 8.33 KHz. The filter operation 36 uses infinite impulse response (FIR) low pass filtering having about 85 taps which reduces cross talk.

Those skilled in the art will recognize that the preferred embodiment may be modified and altered without departing from the true spirit and scope of the invention as defined in the accompanying claims.

What is claimed is:

1. Automatic frequency control apparatus suitable for use in a radio receiver of a carrier signal including an error which shifts the frequency of the carrier signal relative to a first reference frequency, said carrier signal being modulated by a baseband signal containing information to be detected, said information being required to lie within an allowed frequency range, said apparatus comprising in combination:

a converter responsive to said carrier signal to generate a residual carrier signal modulated by said baseband signal, said residual carrier signal having a residual frequency range within said allowed frequency range;

a frequency shifter responsive to a control signal to shift the frequency of said residual carrier signal to generate a frequency shifted signal;

a frequency detector responsive to any frequency error in said frequency shifted signal relative to a second reference frequency to generate said control signal whereby said frequency error in said frequency shifted signal is reduced;

an information detector arranged to detect said information from said frequency shifted signal; and a filter arranged to filter said frequency shifted signal.

2. Apparatus, as claimed in claim 1, wherein said residual carrier signal comprises groups of amplitude values having a single polarity.

3. Apparatus, as claimed in claim 2, wherein said frequency detector estimates said error frequency in response to said groups of values having a single polarity.

4. Apparatus, as claimed in claim 1, wherein said carrier signal is modulated by said baseband signal by amplitude modulation.

5. Apparatus, as claimed in claim 1, wherein said filter passes a range of frequencies less than said allowed frequency range.

6. Apparatus, as claimed in claim 5, wherein said second reference frequency is substantially zero Hz.

7. Apparatus, as claimed in claim 6, wherein said filter comprises a low pass filter.

8. Apparatus, as claimed in claim 1, wherein said detector comprises an envelope detector which detects said information from said residual carrier.

9. Apparatus, as claimed in claim 8, wherein said processor resamples said residual carrier signal so that said residual carrier signal comprises orthogonal signals.

10. Apparatus, as claimed in claim 9, wherein said orthogonal signals are filtered to pass every other one of said orthogonal signals.

11. Apparatus, as claimed in claim 1, and further comprising a digital processor, and wherein said converter, frequency shifter, frequency detector, information detector and filter comprise operations performed by said processor.

12. Apparatus, as claimed in claim 11, wherein said frequency detector estimates said error frequency by executing a maximum a-posteriori estimate.

13. Apparatus, as claimed in claim 11, wherein said carrier signal comprises an intermediate frequency carrier signal and wherein said converter down converts said intermediate frequency carrier signal to said residual carrier signal.

14. Apparatus, as claimed in claim 1, wherein said first reference frequency comprises a VHF broadcast frequency.

15. A method of automatic frequency control suitable for use in a radio receiver of a carrier signal including an error which shifts the frequency of the carrier signal relative to a first reference frequency, said carrier signal being modulated by a baseband signal containing information to be detected, said information being required to lie within an allowed frequency range, said method comprising in combination:

generating a residual carrier signal modulated by said baseband signal in response to said carrier signal, said residual carrier signal having a residual frequency range within said allowed frequency range;

shifting the frequency of said residual carrier signal in response to a control signal to generate a frequency shifted signal;

generating said control signal in response to any frequency error in said frequency shifted signal relative to a second reference frequency, whereby said frequency error in said frequency shifted signal is reduced;

detecting said information from said frequency shifted signal; and filtering said frequency shifted signal.

16. A method as claimed in claim 15 wherein said detecting comprises estimating said error frequency in response to said groups of values having one of a single and a double polarity.

17. A method, as claimed in claim 15, comprising modulating said carrier signal is by said baseband signal by amplitude modulation.

18. A method, as claimed in claim 15, wherein said filtering comprises passing a range of frequencies less than said allowed frequency range.

19. A method as claimed in claim 15 wherein said filtering comprises low pass filtering.

20. A method, as claimed in claim 15, wherein said detecting comprises detecting the envelope of said residual carrier.

21. A method, as claimed in claim 15, wherein said generating a residual carrier signal, shifting, generating said control signal, detecting and filtering are performed by digital processing.

22. A method, as claimed in claim 21, wherein said detecting comprises estimating said error frequency by executing a maximum a-posteriori estimate.

23. A method, as claimed in claim 21, wherein said carrier signal comprises an intermediate frequency carrier signal and wherein said converting comprises down converting said intermediate frequency carrier signal to said residual carrier signal.

24. A method, as claimed in claim 21, wherein said digital processing comprises resampling said residual carrier signal so that said residual carrier signal comprises orthogonal signals.

25. A method, as claimed in claim 24, wherein said orthogonal signals are filtered to pass every other one of said orthogonal signals.

* * * * *